United States Patent
Michel et al.

(10) Patent No.: US 8,804,982 B2
(45) Date of Patent: Aug. 12, 2014

(54) DUAL CELL MEMS ASSEMBLY

(75) Inventors: Alan Dean Michel, Fishers, IN (US); Jeffrey Phillip McAteer, Carmel, IN (US); John Charles Baumhauer, Jr., Indianapolis, IN (US)

(73) Assignee: Harman International Industries, Inc., Stamford, CT (US)

( * ) Notice: Subject to any disclaimer, the term of this patent is extended or adjusted under 35 U.S.C. 154(b) by 743 days.

(21) Appl. No.: 13/095,620

(22) Filed: Apr. 27, 2011

(65) Prior Publication Data

US 2012/0250897 A1    Oct. 4, 2012

Related U.S. Application Data

(60) Provisional application No. 61/471,123, filed on Apr. 2, 2011.

(51) Int. Cl.

| H04R 3/00 | (2006.01) |
|---|---|
| H04R 19/00 | (2006.01) |
| H04R 19/04 | (2006.01) |
| H04R 1/40 | (2006.01) |
| H04R 1/30 | (2006.01) |
| H04R 1/28 | (2006.01) |

(52) U.S. Cl.
CPC .............. H04R 1/406 (2013.01); H04R 19/005 (2013.01); H04R 19/04 (2013.01); H04R 1/30 (2013.01); H01L 2224/48137 (2013.01); H04R 3/005 (2013.01); H04R 1/2807 (2013.01); H01L 2924/3011 (2013.01); H04R 1/2876 (2013.01)
USPC ............... 381/111; 381/91; 381/92; 381/122; 381/355; 381/356; 381/357; 381/361

(58) Field of Classification Search
CPC ............ H04R 1/406; H04R 1/08; H04R 3/00; H04R 1/38; H04R 1/083; H04R 1/086; H04R 1/2807; H04R 1/2876; H04R 1/30; H04R 3/005; H04R 19/005; H04R 19/04; H01L 2224/48137; H01L 2924/3011
USPC ............. 381/111, 91, 92, 122, 355, 356, 357, 381/361
See application file for complete search history.

(56) References Cited

U.S. PATENT DOCUMENTS

| 7,790,492 B1 * | 9/2010 | Baumhauer et al. ............ 438/51 |
| 2007/0047746 A1 * | 3/2007 | Weigold et al. ................ 381/174 |

(Continued)

FOREIGN PATENT DOCUMENTS

| EP | 2 227 034 A1 | 9/2010 |
| EP | 2 252 077 A1 | 11/2010 |
| WO | WO 2010/135290 | 11/2010 |

*Primary Examiner* — Vivian Chin
*Assistant Examiner* — Paul Kim
(74) *Attorney, Agent, or Firm* — Patent Law Office of David G. Beck

(57) ABSTRACT

A transducer assembly utilizing at least two MEMS transducers is provided, the transducer assembly preferably defining either an omnidirectional or directional microphone. In addition to at least first and second MEMS transducers, the assembly includes a signal processing circuit electrically connected to the MEMS transducers, a plurality of terminal pads electrically connected to the signal processing circuit, and a transducer enclosure housing the first and second MEMS transducers. The MEMS transducers may be electrically connected to the signal processing circuit using either wire bonds or a flip-chip design. The signal processing circuit may be comprised of either a discrete circuit or an integrated circuit. The first and second MEMS transducers may be electrically connected in series or in parallel to the signal processing circuit. The first and second MEMS transducers may be acoustically coupled in series or in parallel.

10 Claims, 13 Drawing Sheets

(56) References Cited

U.S. PATENT DOCUMENTS

| | | |
|---|---|---|
| 2008/0267431 A1 | 10/2008 | Leidl et al. |
| 2008/0318640 A1* | 12/2008 | Takano et al. ............ 455/569.1 |
| 2010/0226507 A1* | 9/2010 | Horibe et al. .................. 381/92 |
| 2010/0303274 A1* | 12/2010 | Ryan et al. ................... 381/361 |

\* cited by examiner

DUAL CELL MEMS ASSEMBLY

CROSS-REFERENCE TO RELATED APPLICATION

This application claims the benefit of the filing date of U.S. Provisional Patent Application Ser. No. 61/471,123, filed Apr. 2, 2011, the disclosure of which is incorporated herein by reference for any and all purposes.

FIELD OF THE INVENTION

The present invention relates generally to microelectromechanical system (MEMS) transducers and, more particularly, to a transducer assembly designed to increase electro-acoustical sensitivity and thus electrical signal-to-noise (SNR) of the MEMS assembly by up to 6 dB.

BACKGROUND OF THE INVENTION

Miniature acoustic transducers, for example those fabricated using MEMS fabrication techniques, are used in a variety of applications such as stand-alone microphones, telephone handsets, cellular phones, hearing aids, and headsets. Typically such transducers, along with a microprocessor and interconnects, are mounted within a package that is designed to protect the transducer and associated components from manufacturing process extremes such as high temperature, handling and environmental damage, and electromagnetic interference in use, while providing a convenient means for mounting the device along with means for the sound to access the transducer. While the industry utilizes a number of transducer package designs, the one common feature of each of these assemblies is the use of a single transducer. As a result, regardless of the package design, the maximum achievable sensitivity is limited by the characteristics of the transducer. Accordingly, it is common practice to vary the characteristics of the transducer in order to achieve the desired sensitivity. Therefore what is needed is a means for improving the sensitivity of a MEMS transducer assembly without redesigning the transducer. The present invention provides such a means.

SUMMARY OF THE INVENTION

The present invention provides a transducer assembly utilizing at least two MEMS transducers, the transducer assembly preferably defining either an omnidirectional or directional microphone. In addition to at least first and second MEMS transducers, the assembly includes a signal processing circuit electrically connected to the MEMS transducers, a plurality of terminal pads electrically connected to the signal processing circuit, and a transducer enclosure housing the first and second MEMS transducers. The MEMS transducers may be electrically connected to the signal processing circuit using either wire bonds or a flip-chip design. The signal processing circuit may be comprised of either a discrete circuit or an integrated circuit (IC). The first and second MEMS transducers may be electrically connected in series or in parallel to the signal processing circuit. The first and second MEMS transducers may be acoustically coupled in series or in parallel.

In at least one embodiment of the invention, the signal processing circuit is comprised of an IC and the transducer enclosure includes a substrate and a cover attached to the substrate, where the IC and the first and second MEMS transducers are attached to the substrate. The cover may be fabricated from a metal, an electrically conductive plastic, an electrically conductive composite, an electrically non-conductive plastic coated with an electrically conductive material, an electrically non-conductive composite coated with an electrically conductive material, or a composite material that includes both dielectric and conductive material layers.

In at least one embodiment of the invention, the transducer enclosure includes a substrate and a cover, where the first and second MEMS transducers are attached to the substrate, where the substrate includes a first aperture corresponding to the first MEMS transducer and a second aperture corresponding to the second MEMS transducer, and where the assembly includes a transducer back volume defined by an inner cover surface, the first and second MEMS transducers, and a substrate surface. In at least one configuration, the transducer enclosure includes an acoustic separation wall that divides the transducer back volume into a first back volume corresponding to the first MEMS transducer and a second back volume corresponding to the second MEMS transducer, and where the first and second MEMS transducers are electrically combined out of phase to form a directional microphone. In at least one configuration, the transducer back volume is common to the first and second MEMS transducers and the first and second MEMS transducers are electrically combined in phase to form an omnidirectional microphone. In at least one configuration, the transducer back volume is common to the first and second MEMS transducers and the first and second MEMS transducers are electrically combined out of phase to form a directional microphone. In at least one configuration, the transducer back volume is common to the first and second MEMS transducers, the cover includes a third aperture acoustically coupling the transducer back volume to the ambient acoustic environment, and the first and second MEMS transducers are electrically combined in phase to form a directional microphone.

In at least one embodiment of the invention, the transducer enclosure includes a first substrate, a second substrate and a cap, where the first MEMS transducer is attached to the first substrate and the second MEMS transducer is attached to the second substrate, where the first substrate defines an outer substrate and includes an aperture corresponding to the first MEMS transducer, where the second MEMS transducer is acoustically coupled in series with the first MEMS transducer, where the first and second MEMS transducers are electrically combined out of phase, where the transducer enclosure defines a first back volume corresponding to the first MEMS transducer and a second back volume corresponding to the second MEMS transducer, and where the second substrate includes an aperture aligned with the second MEMS transducer.

A further understanding of the nature and advantages of the present invention may be realized by reference to the remaining portions of the specification and the drawings.

DESCRIPTION OF THE SPECIFIC EMBODIMENTS

The present invention provides an assembly utilizing at least a pair of microelectromechanical system (MEMS) transducers, also referred to herein as cells. Although preferably the MEMS transducers are microphone transducers and the assembly comprises a high sensitivity microphone, it should be understood that in an assembly utilizing two or more MEMS transducers, the transducers may also be speaker transducers or ultrasonic transducers. It should be understood that identical element symbols used on multiple figures refer to the same component, or components of equal functionality. Additionally, the accompanying figures are only meant to illustrate, not limit, the scope of the invention and should not be considered to be to scale.

Figure 1:
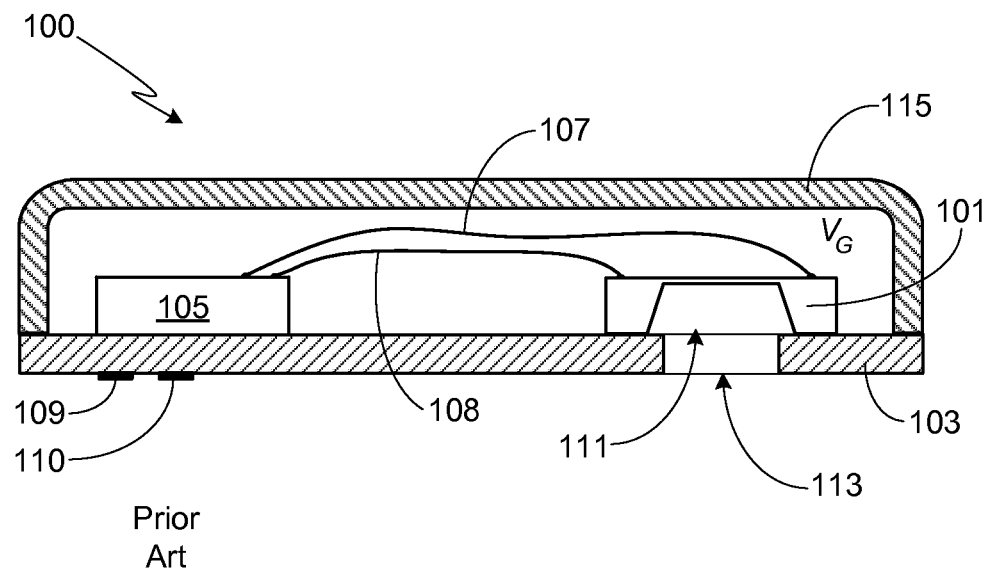
FIG. 1 provides a cross-sectional view of a MEMS microphone assembly utilizing a single MEMS transducer in accordance with the prior art.

For comparison purposes, FIG. 1 provides a cross-sectional view of a MEMS microphone assembly 100 utilizing a single MEMS transducer in accordance with the prior art. As shown, MEMS microphone transducer 101 is attached to a substrate 103. Preferably substrate 103 is a printed circuit board (PCB) that is used as a mounting substrate for transducer 101 as well as other surface mounted components, e.g., signal processing component 105. The various components mounted to substrate 103 may be electrically connected utilizing wire bonds (e.g., wire bonds 107 and 108), metal traces applied to substrate 103, or a combination of both techniques. The fabrication and use of PCBs are well known by those of skill in the industry, such boards typically being comprised of one or more layers of insulating dielectric material (e.g., FR-1, FR-2, FR-3, FR-4, FR-5, CEM-1, CEM-2, CEM-3, CEM-4, CEM-5, etc.) and one or more layers of conductive material (e.g., copper, gold-plated copper, tin-plated copper, tin/lead-plated copper, etc.) into which the metal traces (also referred to as tracks, pathways, etc.) are etched. Also attached to substrate 103 are terminal pads, for example a pair of terminal pads 109/110 as shown.

Figure 2:
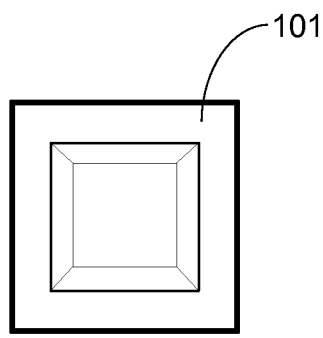
FIG. 2 provides a bottom view of the MEMS die shown in the assembly of FIG. 1.

In this assembly, transducer 101 is mounted to substrate 103 such that the transducer aperture 111 is viewable through aperture 113 of the substrate. Aperture 113 may also be referred to herein as a sound port or an acoustic port. FIG. 2 shows a bottom view of MEMS die 101 taken from the aperture side of the die. As previously noted, preferably transducer 101 is a MEMS microphone transducer, and more preferably a silicon MEMS condenser microphone die.

Typically component 105 is an integrated circuit (IC), and more typically an application-specific integrated circuit (ASIC), that provides transducer signal processing, e.g., signal amplification. While component 105 is shown in FIG. 1 and the additional embodiments shown below as being a separate component, it should be understood that component 105 may also be integrated onto MEMS die 101. Alternately, component 105 may be separate from the MEMS assembly.

Cover 115 is designed to be mechanically attached to the transducer assembly by coupling the cover to substrate 103, and more preferably by coupling the edge of the cover to a peripheral portion of substrate 103. Cover 115 may be comprised of a single piece, as shown, or an assembly of multiple components, i.e., a plurality of side walls and a top section. Typically cover 115 is fabricated from a conductive material, or includes a conductive layer, or is coated with a conductive material, the conductive cover/layer/coating being electrically connected to a conductive layer of substrate 103, for example using a conductive adhesive or solder, thereby providing a shield against electromagnetic interference. The conductive adhesive or solder also provides an acoustic seal. Cover 115 may be fabricated from any of a variety of materials, and may be comprised of a single material or multiple materials. Exemplary materials for cover 115 include a metal (e.g., steel, tin-plated steel, copper, aluminum, tin- or copper-plated aluminum, brass, nickel, etc.), a conductive plastic or composite (e.g., a polymer that has been doped, embedded, or otherwise formed such that it contains a conductive material such as carbon powder/fibers, metallic powder, etc.), a non-conductive material (e.g., plastic) that has been coated with a conductive material on either, or both, of its inner and outer surfaces, or a composite material that includes both dielectric and conductive material layers (e.g., FR-4). Note that the combination of cover 115 and substrate 103 may also be referred to herein as the "MEMS package" or "package assembly".

Figure 3:
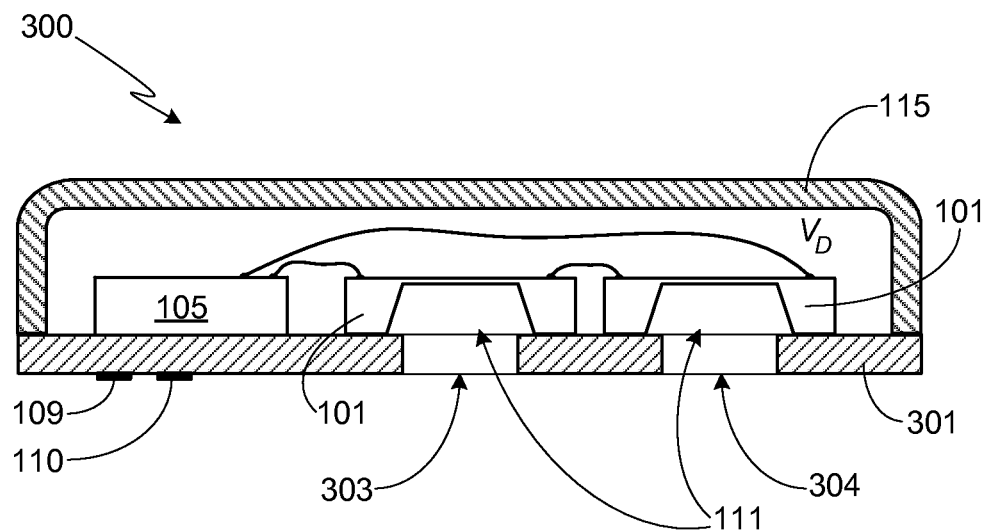
FIG. 3 provides a cross-sectional view of a MEMS microphone assembly utilizing a pair of MEMS transducers in accordance with the invention.

FIG. 3 provides a cross-sectional view of a preferred embodiment of the invention. As shown, assembly 300 includes a pair of MEMS transducers 101, each of which is attached to substrate 301. In at least one embodiment, MEMS transducers 101 are fabricated at the same time and on the same wafer. This approach may be used to achieve virtually identical transducers while potentially simplifying assembly fabrication. For example, after removal (e.g., via sawing) the transducers from the wafer, they may be attached to substrate 301 as a contiguous die pair.

In the embodiment shown in FIG. 3, the transducers are electrically connected in series to IC 105, although as described below the transducers may also be electrically connected in parallel to IC 105. In this embodiment substrate 301 includes a pair of apertures 303/304 corresponding to transducers 101. It should be understood that the embodiment shown in this figure is only an exemplary embodiment of the invention and that other embodiments and configurations are clearly envisioned by the inventors, several of which are described in detail below. The inventors also envision that the presently disclosed transducer assembly may be used with either analog or digital output circuitry. Further, the inventors envision that transducer assembly 300 could alternately utilize one or more apertures within cover 115, thereby allowing sound to enter through the top of the microphone instead of via apertures 303/304.

The inventors have found that by using the dual MEMS transducer approach illustrated above, and illustrated in other configurations below, an increase in microphone sensitivity of up to 6 dB can be achieved. Further increases may be achieved by utilizing more than two MEMS transducers. The basis for these improvements in sensitivity can best be explained by analyzing equivalent circuits.

Figure 4:
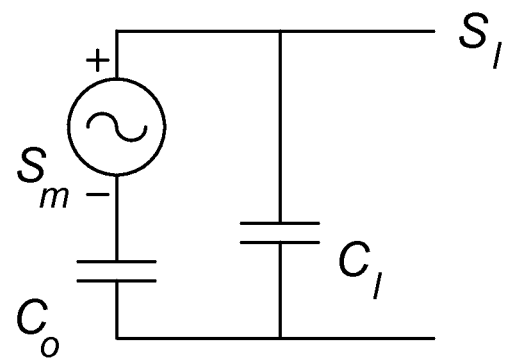
FIG. 4 illustrates an AC equivalent circuit for a single MEMS transducer configuration.

Circuit 400, shown in FIG. 4, represents an AC equivalent circuit to a single MEMS transducer configuration such as that shown in FIG. 1. In the equivalent circuit, $S_m$ is defined as the "motor sensitivity" of the MEMS transducer; $S_l$ is defined as the "stray loaded open-circuit sensitivity"; $C_o$ is defined as the "active motor capacitance"; and $C_l$ is defined as the "motor shunting stray capacitance". These terms are related by the equation:

$$S_l = S_m - 20\log_{10}\left(\frac{C_o + C_l}{C_o}\right), \text{(dB)}.$$

The "normalized motor sensitivity", Sn, is defined as:

$S_n = S_m/S_\infty$, where $S_\infty = S_m$, when $V_G \gg \rho c^2/K_{da}$ is very large. Note that $\rho$ and $c$ represent the air (or other fluid) density and the sound speed in air (or other fluid), respectively, and $V_G$ is defined as the "back volume" of air for the transducer, i.e., the volume of air on the opposite side of the MEMS die from sound port 113. Note that for clarity, $V_G$ is shown in FIG. 1. $K_{da}$ is defined as the "mechanical stiffness expressed in acoustic terms" for the transducer diaphragm and is equivalent to the mechanical stiffness, $K_d$, divided by the square of the diaphragm area, i.e., $A^2$.

Assuming a circular cantilevered plate-type diaphragm of radius "a", the diaphragm area, A, is given by:
$A = \pi a^2$, and the mechanical stiffness, $K_d$, is given by:
$K_d = (192 \pi^2 D)/A$, and the "flexural plate stiffness", D, is given by:
$D = [(Yt^3)/(12(1-r^2))]$, where t is the diaphragm thickness; and Y and r are well known diaphragm mechanical properties. Further, we define $S_{l\infty} = S_l$ when $V_G \gg \rho c^2/K_{da}$.

In order to determine the relationship of back volume $V_G$ and the ratio $S_n$, first we note that:

$$S_m = 20\log_{10}\left(\frac{E_o/A}{h_o K_{Ta}}\right),$$

in dB and where $E_o$ is the "DC polarizing bias voltage", $h_o$ is the "capacitive air gap in the bias state", and $K_{Ta}$ is the "total stiffness express in acoustic terms" and is given by:

$K_{Ta} = K_{da} + K_a$, where the acoustic stiffness, $K_a$, is equivalent to $(\rho c^2/V_G)$. As $$S_\infty = \left(\frac{E_o/A}{h_o K_{Ta}}\right), \text{ and}$$

$$S_n = S_m/S_\infty = \left(\frac{V_G}{V_G + \left(\frac{\rho c^2}{K_{da}}\right)}\right),$$

or inverted, the volume $V_G$ to produce the ratio $S_n$ is:

$$V_G = \left(\frac{\rho c^2}{\left(\frac{1}{S_n} - 1\right)K_{da}}\right).$$

For an exemplary MEMS transducer die, $K_{da}$ is equal to $11.0\,E14\,N/m^5$. Accordingly, for this die the above equations yield Table 1 below.

TABLE 1

| $V_G$ (E-9 m³) | $S_n$ | $S_n$ (~dB) |
|---|---|---|
| 0.499 | 0.794 | -2.0 |
| 1.06 | 0.891 | -1.0 |
| 2.18 | 0.944 | -0.5 |
| 4.36 | 0.971 | -0.254 |
| 4.49 | 0.972 | -0.25 |
| ∞ | 1 | 0 |

Therefore for the selected MEMS transducer, if $V_G$ is equal to 0.5 E-9 m³, $S_n$ is approximately -2.0 dB and both the $S_m$ and $S_l$ are 2.0 dB below their maximum possible sensitivities, $S_\infty$ and $S_{l\infty}$, respectively.

Figure 5:
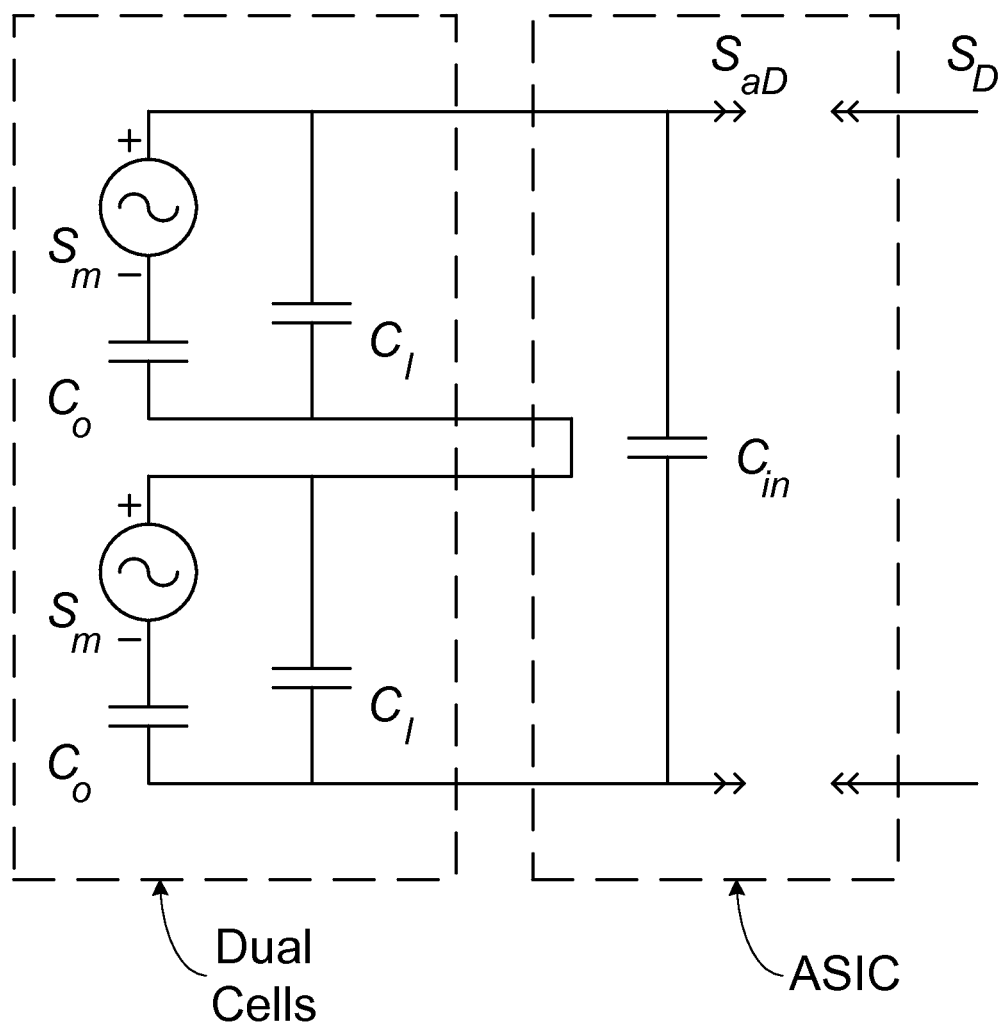
FIG. 5 illustrates an AC equivalent circuit for a dual MEMS transducer configuration in which the transducers are electrically connected in series to the ASIC.

FIG. 5 is the AC equivalent electrical circuit for a dual transducer configuration such as that shown in FIG. 3 in which the transducers are electrically connected to ASIC 105 in series and added (i.e., combined in phase). Applying the above calculations to this configuration, and recognizing that the dual cells are operating acoustically in parallel, then it follows that if:

$$V_D = 2\left(\frac{\rho c^2}{\left(\frac{1}{S_n} - 1\right)K_{da}}\right) = 2V_G,$$

where $V_D$ is the back volume for the dual transducer configuration, then
$S_{lD}(V_D) = S_l(V_G) + 6 = S_{l\infty} + S_n(V_G) + 6$, (dB), where $S_{lD}$ is understood to be equal to $S_{aD}$ when $C_{in} \to 0$, i.e., an open circuit sensitivity. Thus the dual MEMS transducer configuration produces an open circuit sensitivity, $S_{lD}$, that is 6 dB above that achieved for the single transducer configuration having half of the back volume. Accordingly, for any given $V_D$ meeting the above criteria, the sensitivity equation shows that the dual cell configuration open circuit sensitivity exceeds the maximum sensitivity possible with a single cell, i.e., with $V_G = \infty$, by $[6 + S_n(V_G)]$, dB.

As an example, consider the MEMS transducer die described above in which $K_{da}$ is equal to 11.0 E14 N/m⁵. For a $V_G$ of 2.18 E-9 m³, suppose the open circuit sensitivity for a single cell configuration is -48.5 dB V/Pa. The maximum sensitivity, $S_{l\infty}$ (with $V_G = \infty$), is (see table above) -48.5+0.5, or −48.0 dB V/Pa. Therefore a dual cell configuration using a pair of the same die and a back volume $V_D$ of $2V_G$ will have an open circuit sensitivity $S_{lD}$ of −48.0−0.5+6, or −42.5 dB V/Pa. Therefore the dual cell configuration with $V_D$ of 4.36 E-9 m$^3$ will have a sensitivity 5.5 dB above the maximum possible (ideal) single cell sensitivity (with $V_G = \infty$). This 5.5 dB then represents the minimum value added sensitivity of the dual cell configuration over a single cell configuration using the same type of transducer. For less than the ideal case, i.e., where the single cell's $V_G$ is not infinite but is instead equal to 4.36 E-9 m$^3$ (i.e., the same as the dual cell $V_D$), then $S_n$ equals −0.254 dB and $S_l$ equals −48.254 dB V/Pa or 5.754 dB below the $S_{lD}$ of −42.5 dB V/Pa of the dual cell configuration.

From the prior relationship between $S_l$ and $S_m$, it is clear that $S_n = S_l/S_{l\infty}$, where $S_{l\infty}$ depends on $K_{da}$, but not on $V_G$. The prior relationship between the sensitivity of a dual and single transducer design holds where the back volume of the single transducer configuration was half the back volume of the dual transducer configuration. The relationship covering equal back volumes will now be considered, i.e., where $V_G = V_D \equiv V$.

By the definitions given above, $S_l(V) = S_n(V)S_{l\infty}$ where $S_l$ and $S_n$ are functions of back volume, V. Since in an acoustically parallel dual transducer configuration the sound volume velocity from each cell effectively compresses half of back volume V, it follows that:

$$S_{lD}(V) = 2[S_n(V/2)S_{l\infty}]. \text{Therefore}$$

$$\frac{S_{lD}}{S_l}(V) = 2\left(\frac{S_n(V/2)}{S_n(V)}\right), \text{ or}$$

$$S_{lD}(V) = S_l(V) + 6 + S_n(V/2) - S_n(V), \text{ (dB)}.$$

Therefore for the same back volume, V, the dual transducer configuration of the invention has a sensitivity advantage $S_{lD}(V) - S_l(V)$ of $[6 + S_n(V/2) - S_n(V)]$, dB, over a conventional single transducer configuration. This conclusion assumes that both configurations use the same transducer die.

Therefore for a MEMS transducer having a $K_{da}$ equal to 11.0 E14 N/m$^5$, the advantage offered by the present invention for a V of 4.36 E-9 m$^3$ is 5.754 dB (i.e., 6−0.5+0.254). Even if the $K_{da}$ were half that of the above example, i.e., equal to 5.5 E14 N/m$^5$, the increase in sensitivity offered by the present invention is 5.53 dB. Thus the dual transducer configuration of the present invention provides a very substantial sensitivity gain even with a reduced $K_{da}$. This is particularly important given that a MEMS transducer motor sensitivity, $S_m$, which is subject to its diaphragm electrostatic stability constraint, is potentially higher if $K_{Ta}$, and thus $K_{da}$, can be reduced.

Figure 6:
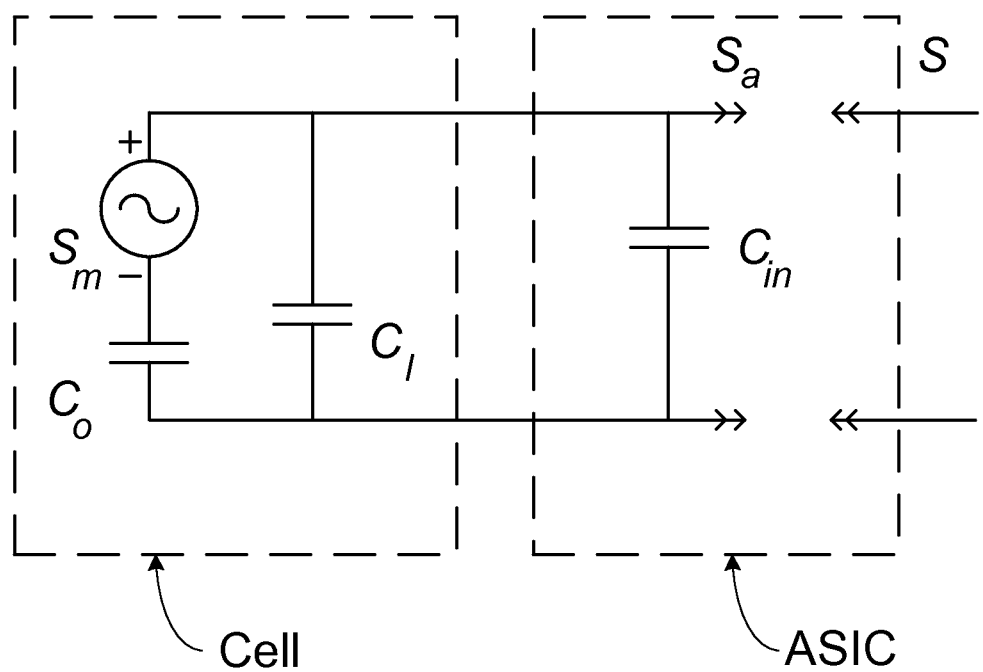
FIG. 6 illustrates the AC equivalent circuit of FIG. 4 with the addition of the connected ASIC.

FIG. 6 illustrates the AC equivalent circuit for the single transducer configuration as shown in FIG. 4, with the addition of the input capacitance, $C_{in}$, of the ASIC amplifier (i.e., component 105). The MEMS output sensitivity, S, is proportional to $S_a$, the ASIC input sensitivity. It follows that:

$$S_a = S_m\left(\frac{C_o}{C_o + C_l + C_{in}}\right),$$

where $S_a = S_l$ with $C_{in} \to 0$.

For the circuit shown in FIG. 5, including the input capacitance, the output sensitivity, $S_D$, is proportional to the ASIC amplifier input sensitivity, $S_{aD}$. It follows that:

$$S_{aD} = 2S_m\left(\frac{\frac{C_o}{2}}{\frac{C_o}{2} + \frac{C_l}{2} + C_{in}}\right),$$

where $S_{aD} = S_{lD}$ with $C_{in} \to 0$.

Defining the term $\alpha$ to be equivalent to $[(C_o + C_l)/C_{in}]$, then:

$$\frac{S_{aD}}{S_a} = \frac{2(\alpha + 1)}{(\alpha + 2)}.$$

Note that as $\alpha$ becomes very large (i.e., as $\alpha \to \infty$), the dual transducer configuration in which the transducers are electrically connected and added in series will exceed the performance of a conventional single transducer configuration by a factor of 2, i.e., by 6 dB. This series configuration will work well with a voltage type of amplifier. This assumes a large V as discussed above. Using the same assumption, if $\alpha$ is equal to 4, the dual transducer configuration yields an improvement of 4.4 dB over a conventional configuration while an $\alpha$ equal to 1 still yields an improvement of 2.5 dB. Accordingly, for a dual transducer configuration in which the transducers are electrically connected in series, preferably $\alpha \geq 1$, more preferably $\alpha \geq 4$, and still more preferably $\alpha \geq 30$. The overall advantage provided by the electrically series dual cell configuration is given by:

$$[S_{lD}(V) - S_l(V)] - 20\log_{10}\left(\frac{\alpha + 2}{\alpha + 1}\right), \text{ (dB)}$$

In an exemplary configuration, V is equal to 4.36 E-9 m$^3$, $K_{da}$ is equal to 11.0 E14 N/m$^5$, $C_o$ is equal to 2.5 pF, $C_l$ is equal to 0.5 pF, and $C_{in}$ is equal to 0.1 pF. Based on this configuration, the dual transducer configuration described above in which the transducers are connected in electrical series will yield an improvement of approximately 5.5 dB.

Figure 7:
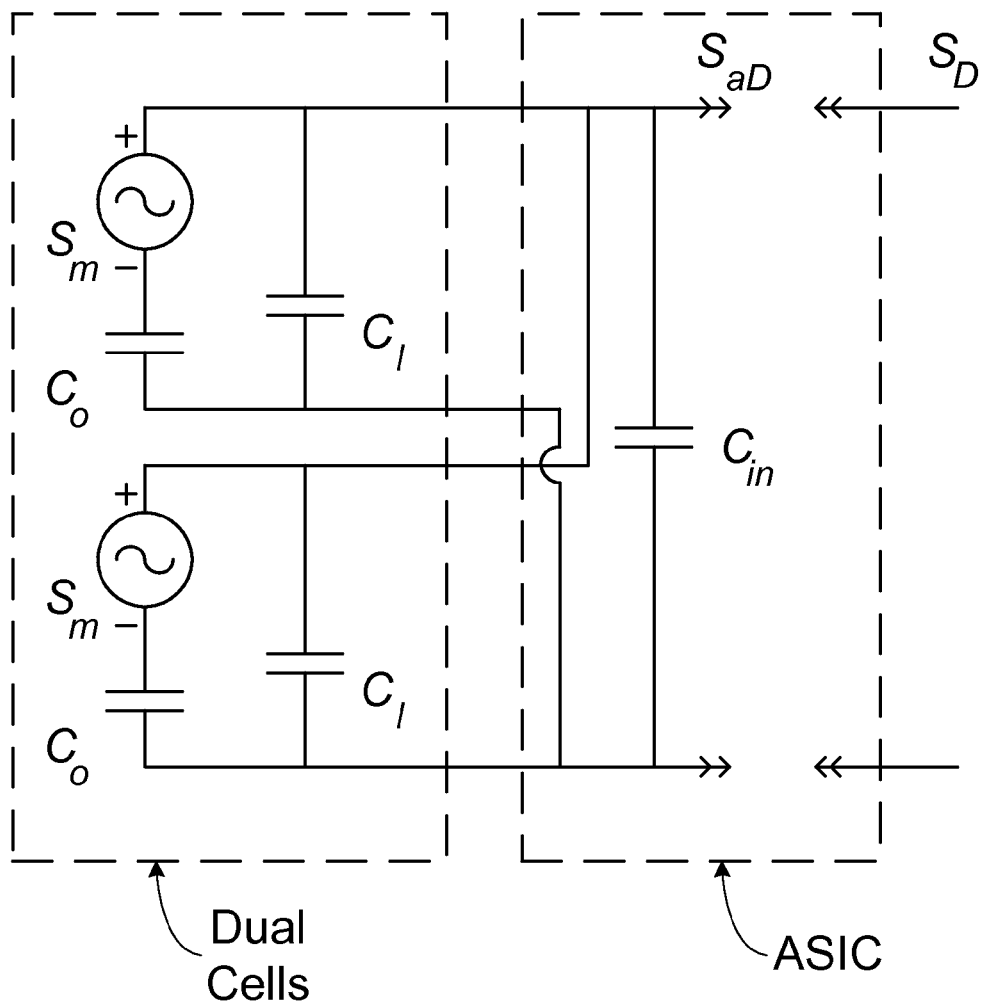
FIG. 7 illustrates an AC equivalent circuit for a dual MEMS transducer configuration in which the transducers are electrically connected in parallel to the ASIC.

FIG. 7 provides the AC equivalent circuit for an alternate dual transducer configuration, specifically one in which the transducers are electrically connected in parallel to IC 105 and added. For this configuration:

$$S_{aD} = 2S_m\left(\frac{C_o}{2C_o + 2C_l + C_{in}}\right),$$

which yields:

$$\frac{S_{aD}}{S_a} = \frac{2(1 + \alpha)}{(1 + 2\alpha)}.$$

Figure 16:
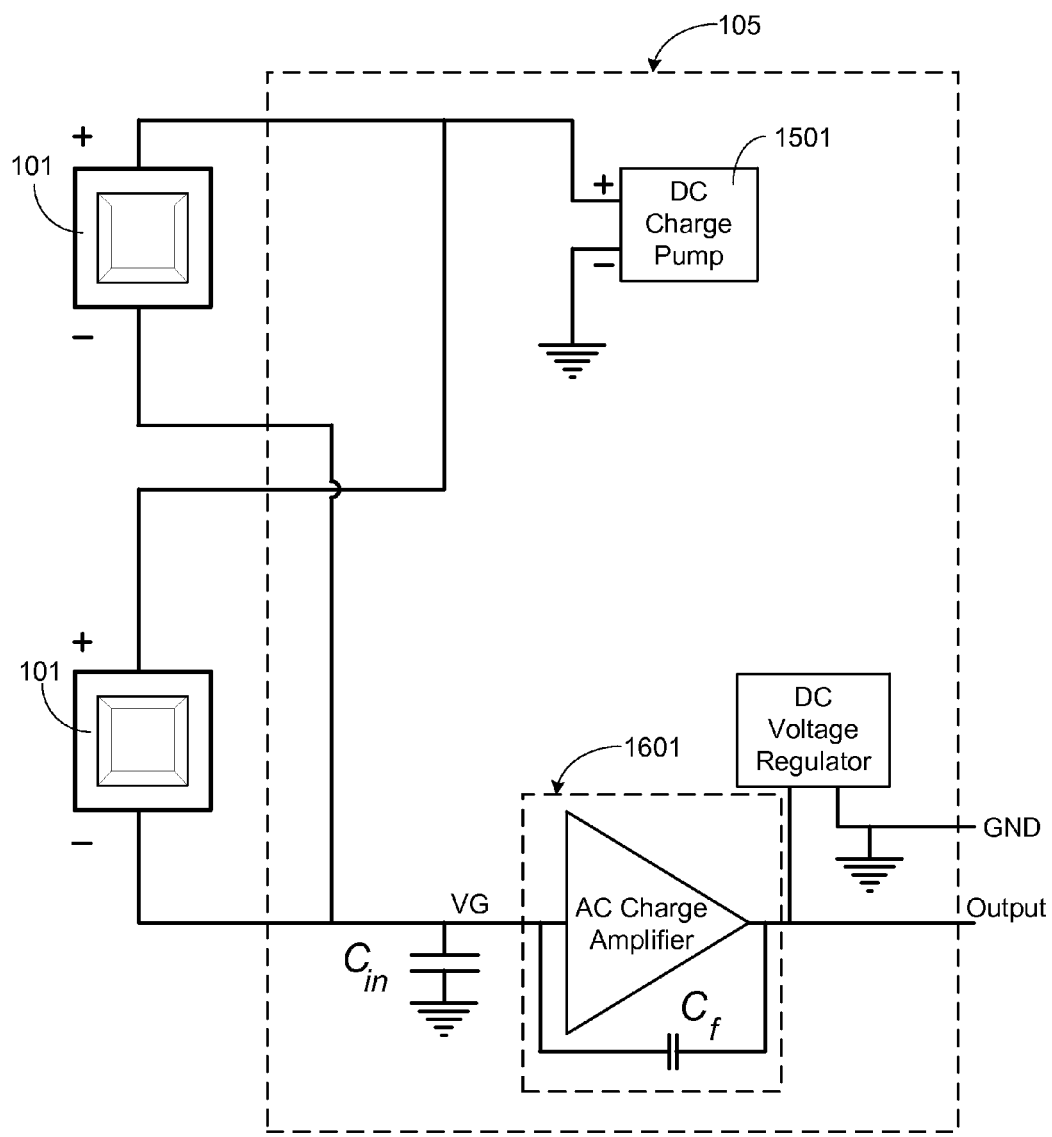
FIG. 16 illustrates an alternate ASIC suitable for use when the dual MEMS transducers of the invention are to be added and are electrically connected in parallel.

Therefore for this and other dual cell electrically parallel configurations described herein, it is seen that unless $\alpha$ is small and thus $C_{in}$ large, the desired two-fold sensitivity increase (i.e., 6 dB) will not be realized with a conventional voltage amplifier. Unfortunately, large $C_{in}$ will reduce the $S_{aD}$ signal. Accordingly, a more appropriate charge-type amplifier, as described below and shown in FIG. 16, is required. In such an amplifier, the effective AC voltage drop across $C_{in}$ approaches zero. Thus, in effect, because the parallel dual cell signal currents will be added, and the AC current through $C_{in}$ will approach zero, the advantage provided by the parallel dual cell configuration, over a single cell configuration, is given by:

$[S_{ID}(V) - S_I(V)]$, (dB), independent of $\alpha$.

Figure 8:
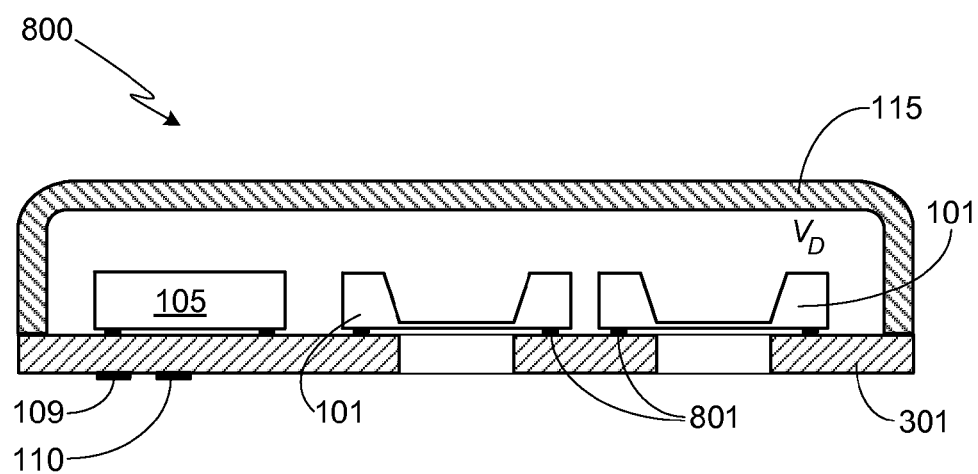
FIG. 8 provides a cross-sectional view of a MEMS microphone assembly similar to the configuration shown in FIG. 3, except that a flip-chip assembly design is employed.

In the configuration illustrated in FIG. 3, MEMS transducers 101 are coupled to ASIC 105 as well as to each other using wire bonds. It should be understood that the invention is not limited to wire bonding, regardless of whether the transducers are electrically connected in series or in parallel. For example, FIG. 8 illustrates a dual transducer configuration 800 that is similar to configuration 300 except that transducers 101 and IC 105 are in direct electrical connection to contact pads and paths on substrate 103, thus eliminating the need for wire bonding. In this flip-chip configuration, the components comprising the assembly, i.e., transducers 101 and IC 105 are flipped in order to allow conductive bumps (for example, bumps 801) on the components to contact bond pads on substrate 103. It will be appreciated that the flip-chip approach may be used with either serially connected transducers or transducers that are electrically connected in parallel. Note that the use of a flip-chip configuration does not alter the sensitivity advantages offered by the present invention.

Figure 9:
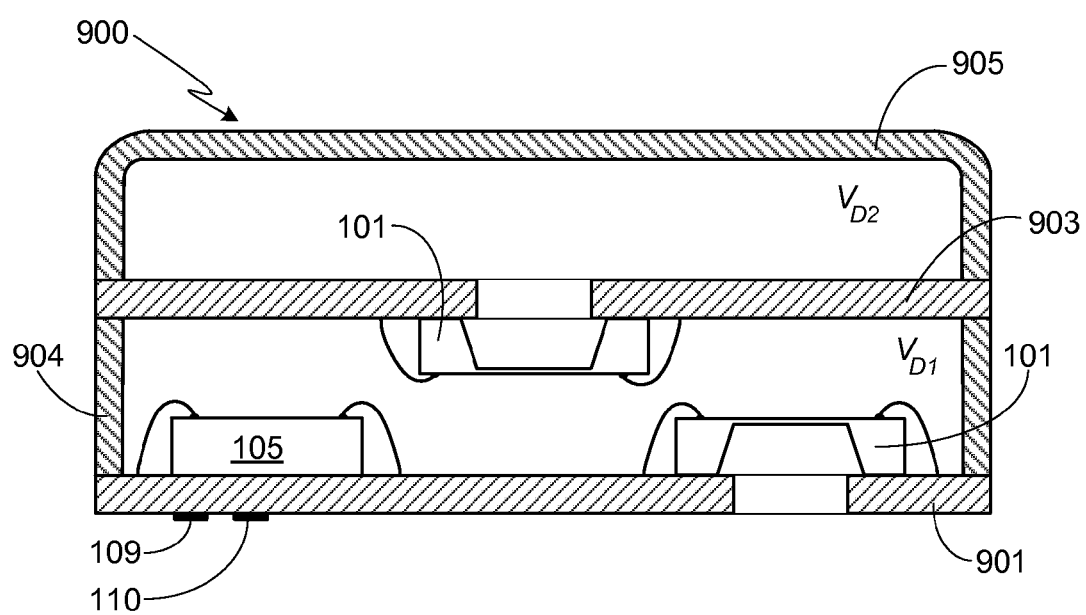
FIG. 9 provides a cross-sectional view of a MEMS microphone assembly utilizing a pair of MEMS transducers that are acoustically coupled in series.
Figure 10:
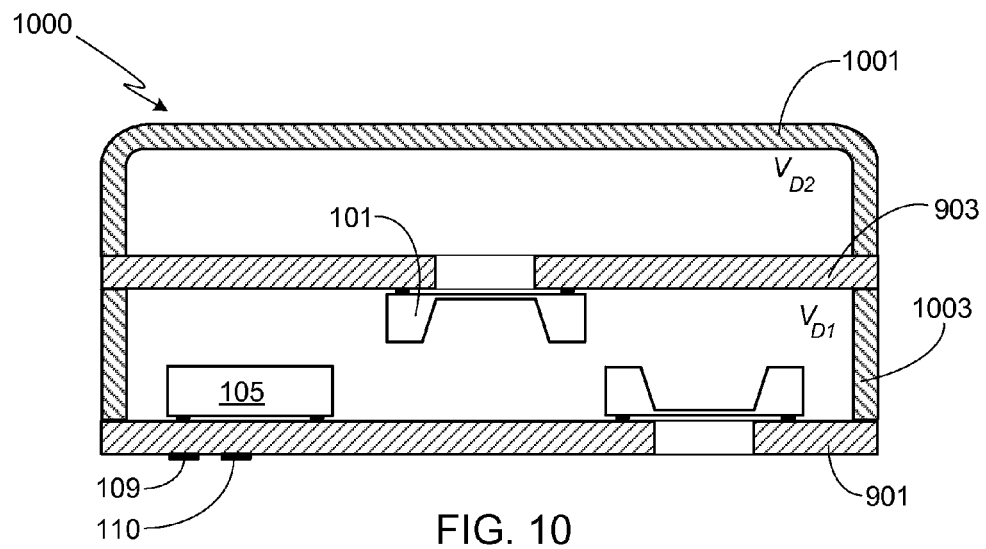
FIG. 10 provides a cross-sectional view of a MEMS microphone assembly similar to the configuration shown in FIG. 9, except that a flip-chip design is employed instead of wire bonds.
Figure 17:
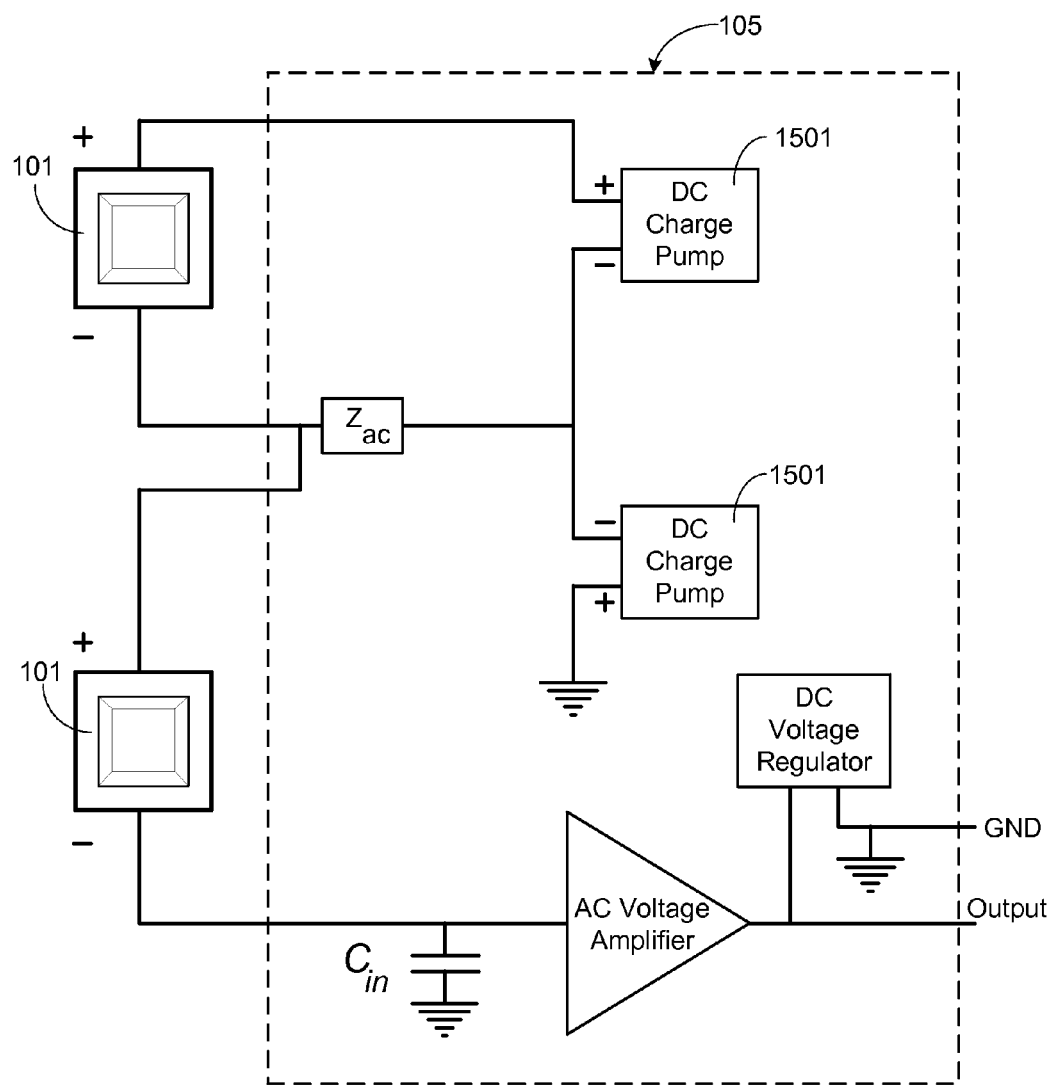
FIG. 17 illustrates an ASIC suitable for use when the dual MEMS transducers of the invention are to be subtracted and are electrically connected in series.
Figure 18:
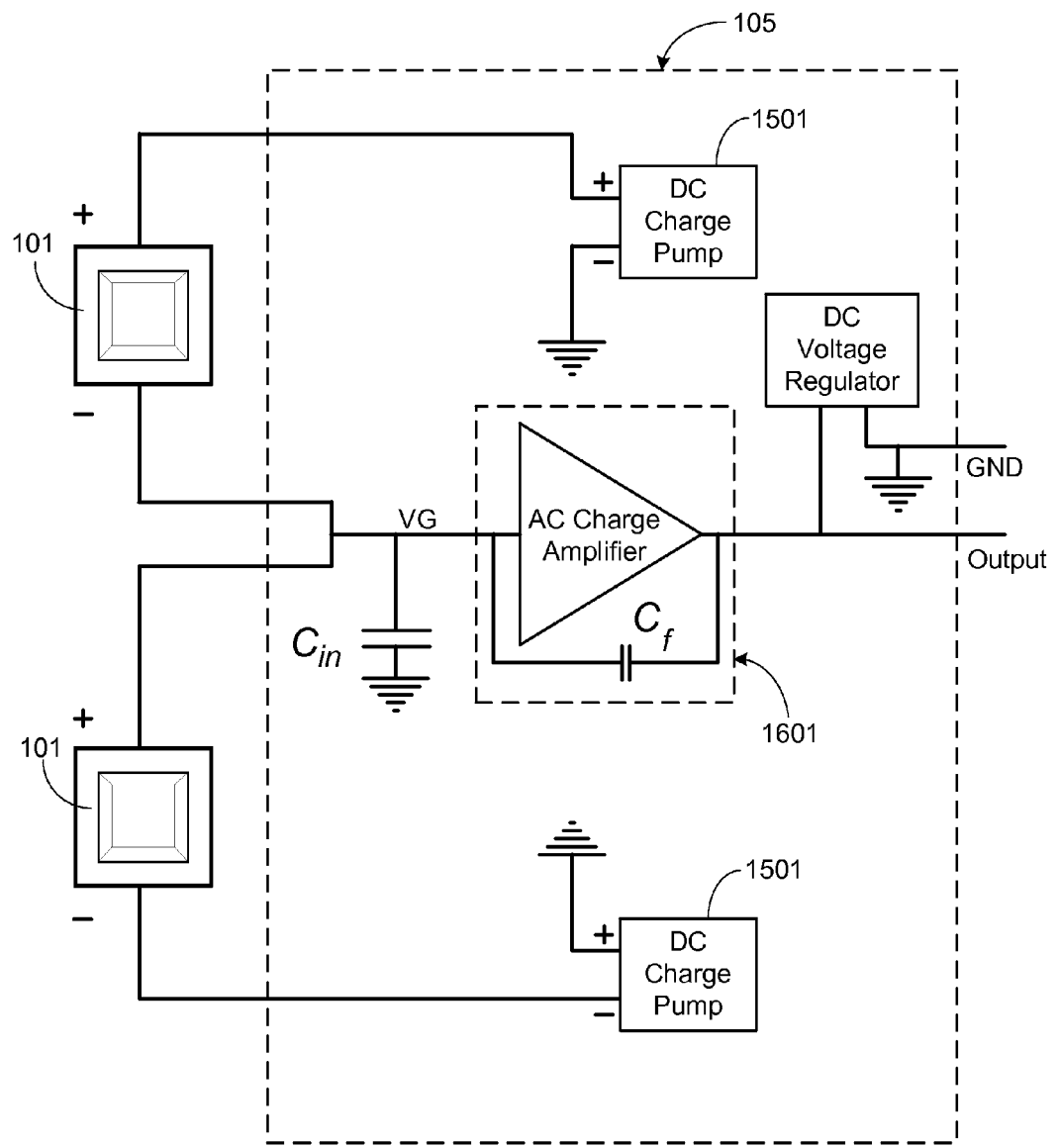
FIG. 18 illustrates an alternate ASIC suitable for use when the dual MEMS transducers of the invention are to be subtracted and are electrically connected in parallel.

In the dual transducer configurations illustrated in FIGS. 3 and 8, the transducers are acoustically coupled in parallel. The present invention may also be used in configurations in which the transducers are acoustically coupled in series, regardless of whether the transducers are electrically connected in series or in parallel. For example, FIGS. 9 and 10 illustrate configurations with transducers 101 being positioned in acoustic series, system 900 utilizing both wire bonding and metal paths and system 1000 utilizing a flip-chip design. In these acoustical series dual transducer designs it is important that the MEMS die have a relatively low mechanical diaphragm stiffness, $K_d$, in order for the disclosed dual cell approach to achieve a significant advantage over a conventional single cell design. Additionally, in these two configurations the two transducers should be electrically connected out of phase (i.e., subtracted) from one another since the pressure within volume $V_{D1}$ is substantially out of phase with the signal pressure outside of the assembly. ASIC amplifier circuits to accomplish this subtraction with the cells electrically connected in series and in parallel are shown in FIGS. 17 and 18, respectively.

In the designs shown in FIGS. 9 and 10, the two transducers are attached to two different substrates 901 and 903, thus providing a second back volume $V_{D2}$ in addition to first back volume $V_{D1}$. Package assembly 900 utilizes wire bonding while package assembly 1000 utilizes flip-chip mounting and connection. In package assembly 900, cap 905 may either be a single piece cap or comprised of multiple sections, i.e., a plurality of side wall sections along with a top section. In package assemblies 900 and 1000, means must be used to electrically connect substrate 903, and more specifically the transducer electrically connected to substrate 903, to ASIC 105. Such connection may be made on a wall (e.g., wall sections 904 and 1003) via metal traces.

Figure 11:
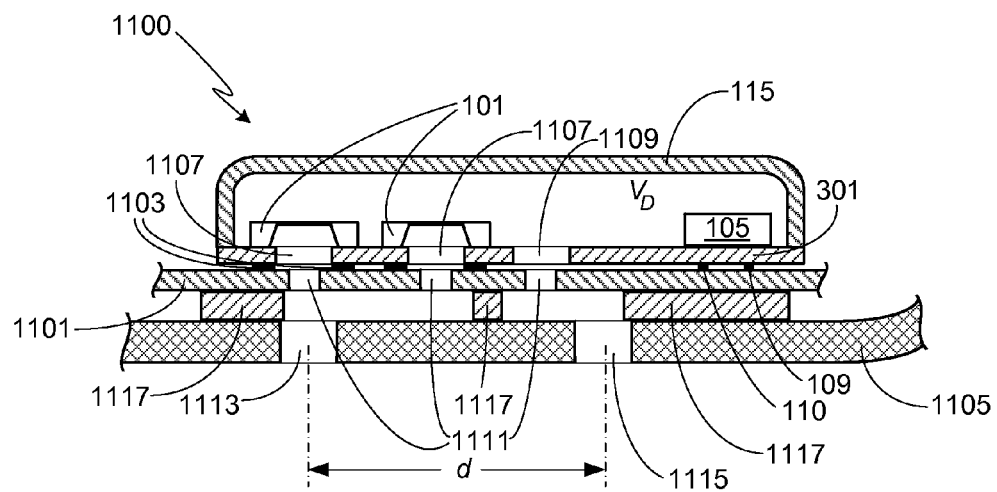
FIG. 11 provides a cross-sectional view of an exemplary directional microphone assembly that is designed to take advantage of the sensitivity improvements offered by a dual transducer configuration in accordance with the present invention.

The present invention may be configured as either an omnidirectional microphone assembly, for example as illustrated in FIGS. 3 and 8-10, or as a directional microphone assembly. FIG. 11 illustrates an exemplary directional microphone assembly 1100 that is designed to take advantage of the sensitivity improvements offered by a dual transducer configuration as presently disclosed. In both FIGS. 11 and 12, the transducers are added. Note that in the embodiments illustrated in FIG. 11, as well as those that follow, the transducers are shown utilizing a conventional electrical connection scheme. To simplify these figures the wire bonds that are used to couple the transducers, IC 105, etc. are not shown. Additionally, it should be understood that these embodiments could equally employ a flip-chip design as previously described. Lastly, these figures are only meant to illustrate, not limit, various transducer configuration and that the inventors clearly envision minor variations of these configurations depending upon the application, housing style, desired size and cost, etc. It should be understood that unless otherwise noted, the directional microphone transducer configurations shown in FIGS. 11-14 may be electrically connected in series or in parallel, for example based on the selected ASIC and whether the transducers are to be added or subtracted.

In assembly 1100 shown in FIG. 11, the transducer package is attached to application PCB 1101 using contact pads 109/110 and preferably a plurality of surface mount solder pads 1103 that also serve to acoustically seal 1107 to 1111. PCB 1101 is mechanically coupled to application housing 1105 using gasket 1117. Housing 1105 may be, for example, a telephone mouthpiece, such as on a mobile phone, or other microphone housing. In this configuration, in addition to the sound ports 1107 that correspond to transducers 101, the transducer package includes an additional sound port 1109 that is acoustically coupled to the back volume, $V_D$, of the assembly. PCB 1101 includes a plurality of apertures 1111 that correspond to the sound ports of the transducer package. As shown, housing 1105 includes at least one aperture 1113 that corresponds to sound ports 1107 of transducers 101, and at least one aperture 1115 that corresponds to the sound port 1109 associated with the back volume, $V_D$. Housing 1105 is separated from PCB 1101 using gasket 1117. Preferably gasket 1117 also provides the means for acoustically segregating sound port 1113 from sound port 1115, and thus segregating the transducer sound ports 1107 from the back volume sound port 1109 as illustrated. Note that gasket(s) 1117 may be fabricated from any of a variety of materials (e.g., closed-cell foam, rubber, paper, plastic, etc.) and use any of a variety of shapes (e.g., tubes, flat gaskets with apertures, etc.).

As shown in FIG. 11, apertures 1113 and 1115 are separated by a distance "d". It is well known by those of skill in the art that the distance d is a determining factor in the directional or polar response of the directional microphone as well as its sensitivity and frequency response.

Microphone assembly 1200 includes a minor modification of the previous embodiment. As shown, back volume transducer package sound port 1109 is moved from substrate 301 to cap 115. Corresponding housing port 1115 is also moved from the front surface of the housing to the rear surface, as shown. In addition to changing the directional properties of the assembly, movement of ports 1109 and 1115 also eliminates the need for one of the apertures 1111 passing through PCB 1101. Note that if different acoustical properties are desired (i.e., a different polar directivity pattern) acoustic damping or resistance material having an advantageous resistance level may be positioned within or abutting one or more ports or apertures (e.g., 1107, 1109, 1111, 1113, or 1115). Alternately, $V_D$ may be changed or the location of the sound ports (e.g., sound ports 1113 and 1115) may be altered.

Figure 12:
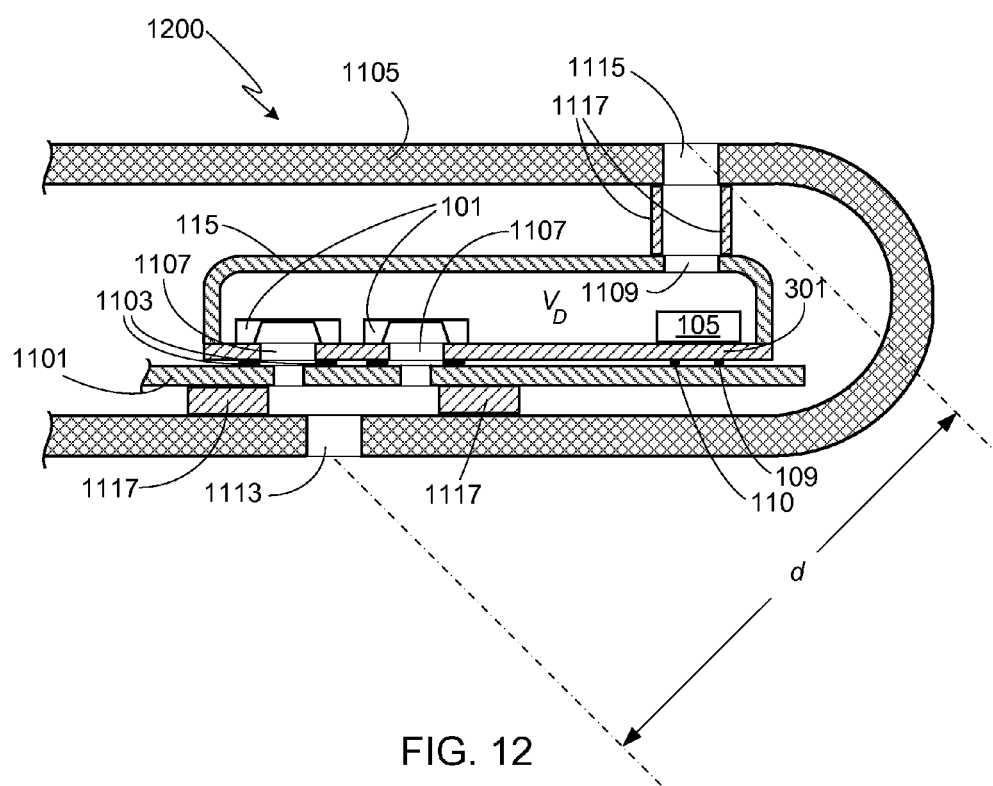
FIG. 12 provides a cross-sectional view of an alternate directional microphone assembly configuration.

The present invention, and more particularly the use of dual MEMS transducers, has been described both in terms of omnidirectional microphones (e.g., FIGS. 3 and 8-10) and directional microphones (e.g., FIGS. 11 and 12). While the sensitivity benefits associated with dual transducers have been described, it should be noted that the use of dual transducers in a directional microphone offers a further advantage over their use in an omnidirectional microphone. In particular, because apertures 1109 and 1115 provide a pressure release to the back volume, $V_D$, in the directional embodiments shown in FIGS. 11 and 12, the directional microphone embodiments can offer a full 6 dB of sensitivity improvement over corresponding conventional single transducer configurations. Of course, the 6 dB of improvement is still subject to being decreased by any amplifier losses associated with $C_{in}$ and parameter α if a voltage amplifier (series connection) is used as described in detail herein.

Figure 13:
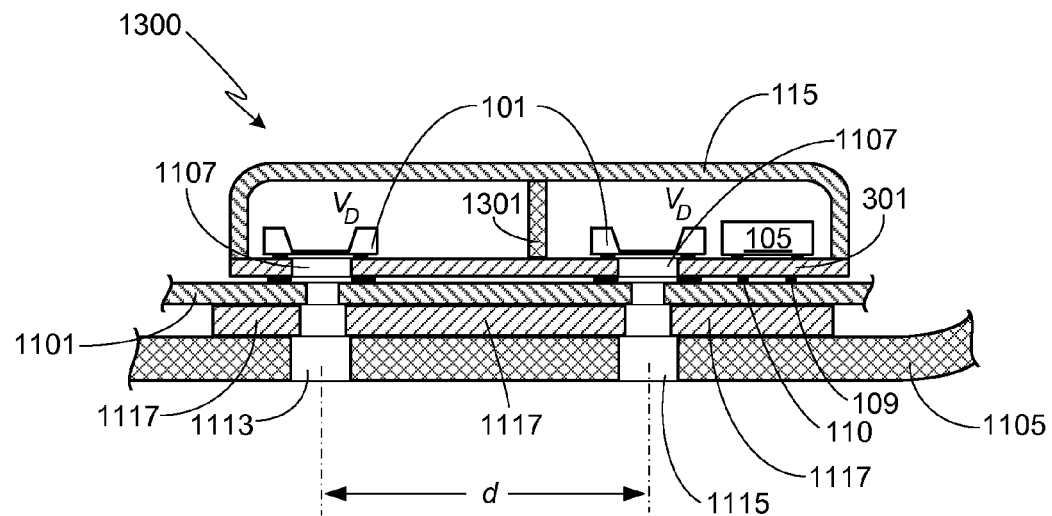
FIG. 13 provides a cross-sectional view of an alternate directional microphone assembly configuration.
Figure 14:
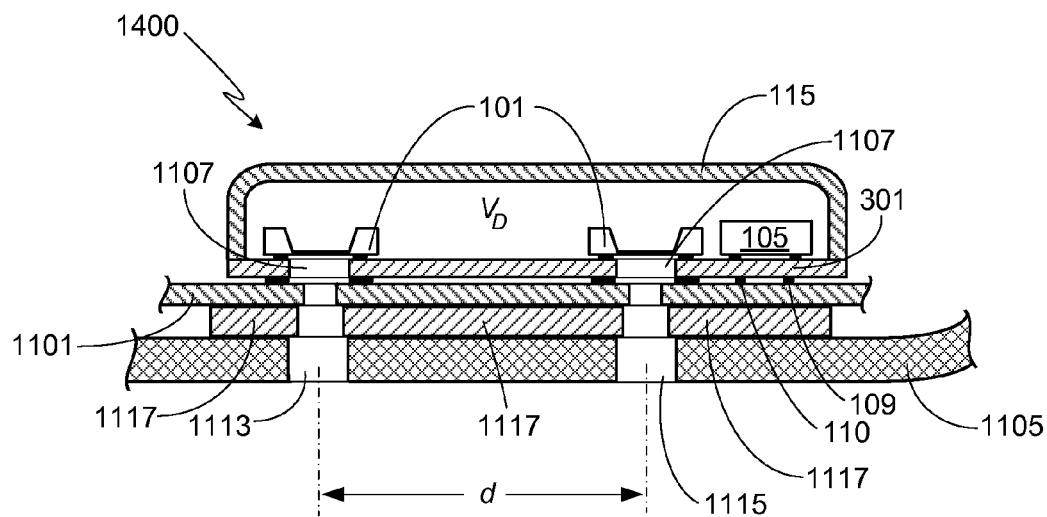
FIG. 14 provides a cross-sectional view of an alternate directional microphone assembly configuration.

FIGS. 13 and 14 illustrate two other dual transducer directional microphone embodiments. Assembly 1300 uses an acoustic separation wall 1301 to form two individual back volumes $V_D$. Separation wall 1301 would generally be acoustically opaque, but could be partially acoustically transparent, for example at low frequencies. In essence, assembly 1300 forms two individual omnidirectional microphones, one associated with each transducer 101. While the transducers may be electrically connected either in series or in parallel, they must be combined out of phase (i.e., subtracted) in order to form a first order gradient directional microphone. Assemblies 1300 and 1400 are illustrated with flip-chip designs, but either may be configured to utilize conventional connections, e.g., wire bonds, as previously described.

FIGS. 15-18 illustrate a variety of circuits that may be used with the dual cell configurations described above, the illustrated circuits providing the proper DC bias voltage for each MEMS cell. Additionally, FIGS. 16 and 18 illustrate the use of a charge amplifier that can be used to further enhance performance of the dual cell configuration. It should be understood, however, that the disclosed dual cell configurations are not limited to the use of these circuits and that other circuits may be used to equal advantage.

Figure 15:
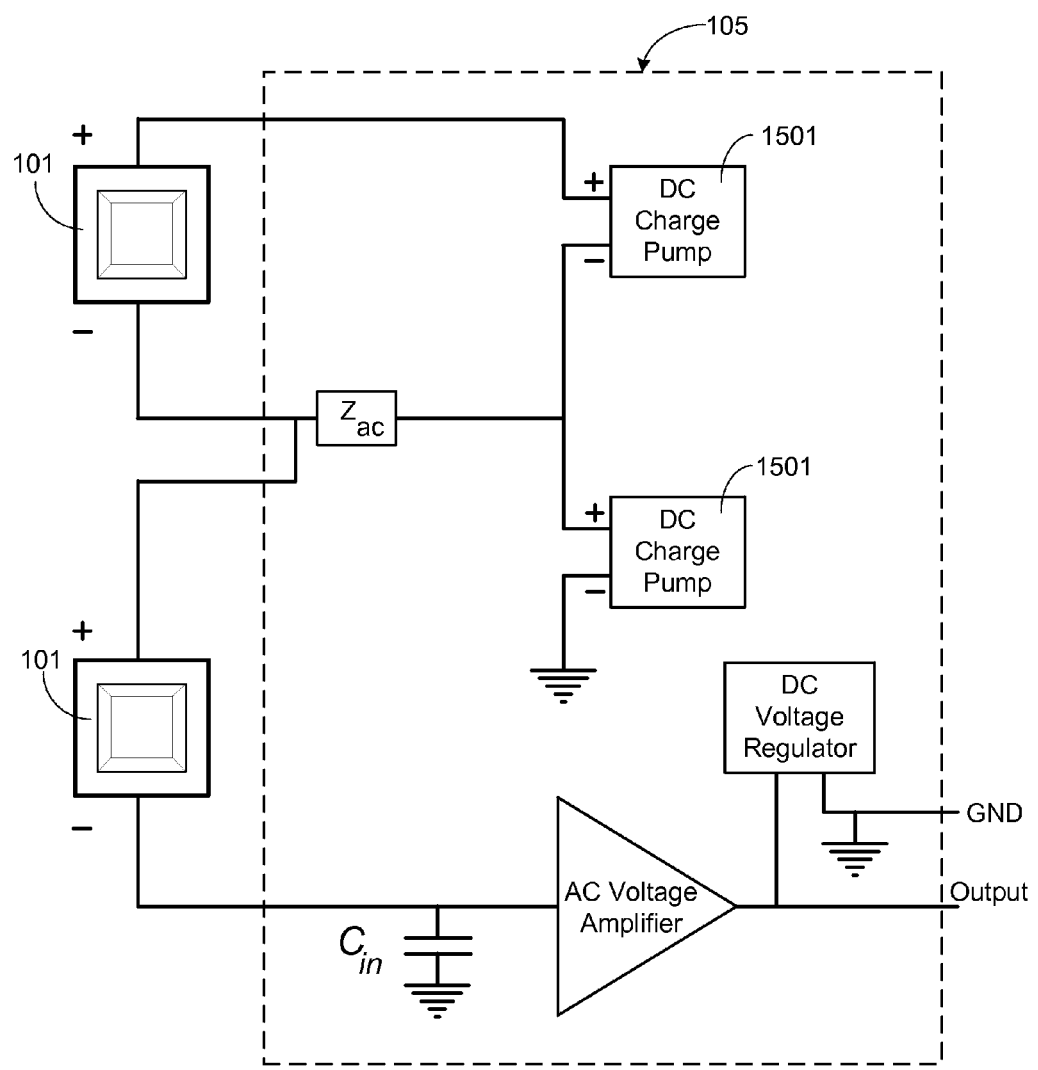
FIG. 15 illustrates an ASIC suitable for use when the dual MEMS transducers of the invention are to be added and are electrically connected in series.

FIG. 15 illustrates an ASIC voltage amplifier 105 with a very low $C_{in}$. Accordingly and as previously noted, such an ASIC is ideally suited for use with the invention in the configurations shown in FIGS. 3, 8, 11 and 12 in which the dual MEMS transducers are to be added and are electrically connected in series. In this ASIC, a pair of DC charge pumps 1501 having the polarity shown are used in order to DC bias the electrostatic capacitance of each MEMS die 101. As a result, in order to avoid an AC short, the following condition must be met:

$$Z_{ac} \gg \frac{1}{j\omega(C_o + C_l)}.$$

FIG. 16 illustrates an alternate ASIC charge amplifier that can also be used with the configurations shown in FIGS. 3, 8, 11 and 12 in which the dual cell transducers are to be added and are in parallel electrically. The charge amplifier is known to present a virtual ground (VG in the figure) at the ASIC input for the AC signal from the dual transducers. As a result, the stray capacitance, $C_l$, shunting each cell's active parameters, $S_m$ and $C_o$, will not affect, i.e., reduce, the ASIC AC output sensitivity, $S_D$. Also note that in this configuration the input capacitance, $C_{in}$, of the charge amplifier does not affect $S_D$, since there is virtually no AC voltage drop across the ASIC input, and therefore the AC input impedance approaches zero. The charge amplifier integrates, via $C_f$, the combined transducers signal current at the virtual ground and converts it to a voltage output, $S_D$. Since the input impedance at the virtual ground is low, the dual cell short circuit signal current is equivalent to twice $S_m C_o j\omega$, and thus offers (depending upon the back volume) a 6 dB potential advantage due to the dual cells as described above.

FIGS. 17 and 18 illustrate ASIC amplifiers suitable for providing the subtraction required of dual cells in the embodiments shown in FIGS. 9, 10, 13 and 14. FIG. 17 is the same circuit as that shown in FIG. 15 except for the reversed polarity on one of the two DC charge pumps 1501, where both FIGS. 15 and 17 are for dual cells in electrical series.

FIG. 18 is another configuration using an ASIC charge amplifier to be used with electrically parallel configurations. Again the virtual ground, VG, plays a critical and advantageous role. This configuration can provide (depending upon back volume) a full 6 dB advantage, independent of α, due to the use of dual cells.

As will be understood by those familiar with the art, the present invention may be embodied in other specific forms without departing from the spirit or essential characteristics thereof. For example, the microphone assemblies of the invention may be fabricated without a support substrate as disclosed in U.S. Pat. No. 7,825,509, or fabricated on an interior support frame as disclosed in co-pending U.S. patent application Ser. No. 12/456,188, the disclosures of which are incorporated herein for any and all purposes. Additionally, microphone assemblies in accordance with the invention may use more than two MEMS transducers, thus offering even further improvements in acoustical sensitivity and/or directionality. Accordingly, the disclosures and descriptions herein are intended to be illustrative, but not limiting, of the scope of the invention which is set forth in the following claims.

What is claimed is:

1. A transducer package, comprising:
at least a first MEMS transducer and a second MEMS transducer, wherein said first MEMS transducer is acoustically coupled to said second MEMS transducer;
a signal processing circuit, wherein said first and second MEMS transducers are electrically connected to said signal processing circuit;
a plurality of terminal pads electrically connected to said signal processing circuit;
a transducer enclosure, said transducer enclosure housing said first and second MEMS transducers, wherein said transducer enclosure further comprises a substrate and a cover attached to said substrate, wherein said first and second MEMS transducers are attached to said substrate, wherein said substrate further comprises a first aperture aligned with a first transducer aperture corresponding to said first MEMS transducer, wherein said substrate further comprises a second aperture aligned with a second transducer aperture corresponding to said second MEMS transducer, wherein a transducer back volume is substantially defined by an inner surface of said cover, said first and second MEMS transducers, and a surface of said substrate, wherein said transducer back volume is common to said first and second MEMS transducers, wherein said transducer enclosure further comprises a third aperture acoustically coupling said transducer back volume to an ambient acoustic environment, and wherein said first MEMS transducer is electrically combined with said second MEMS transducer in phase to form a directional microphone.

2. The transducer package of claim 1, wherein said first and second MEMS transducers are electrically connected to said signal processing circuit utilizing a plurality of wire bonds.

3. The transducer package of claim 1, wherein said transducer package utilizes a flip-chip design.

4. The transducer package of claim 1, wherein said signal processing circuit is comprised of a discrete circuit.

5. The transducer package of claim 1, wherein said signal processing circuit is comprised of an integrated circuit (IC).

6. The transducer package of claim 1, wherein said cover is fabricated from a material selected from the group consisting of a metal, an electrically conductive plastic, an electrically conductive composite, an electrically non-conductive plastic coated with an electrically conductive material, an electrically non-conductive composite coated with an electrically conductive material, or a composite material that includes both dielectric and conductive material layers.

7. The transducer package of claim 1, wherein said substrate further comprises said third aperture acoustically coupling said transducer back volume to said ambient acoustic environment.

8. The transducer package of claim 1, wherein said cover further comprises said third aperture acoustically coupling said transducer back volume to said ambient acoustic environment.

9. The transducer package of claim 1, wherein said first and second MEMS transducers are comprised of a contiguous die pair.

10. A transducer package, further comprising:
   at least a first MEMS transducer and a second MEMS transducer, wherein said first MEMS transducer is acoustically coupled to said second MEMS transducer;
   a signal processing circuit, wherein said first and second MEMS transducers are electrically connected to said signal processing circuit;
   a plurality of terminal pads electrically connected to said signal processing circuit;
   a transducer enclosure, said transducer enclosure housing said first and second MEMS transducers, wherein said transducer enclosure further comprises at least a first substrate and a second substrate and a cap, wherein said first MEMS transducer is attached to said first substrate and said second MEMS transducer is attached to said second substrate, wherein said first substrate defines an outer substrate and further comprises a first aperture aligned with a first transducer aperture corresponding to said first MEMS transducer, wherein said second MEMS transducer is acoustically coupled in series with said first MEMS transducer, wherein said first MEMS transducer is electrically combined with said second MEMS transducer out of phase, wherein said transducer enclosure defines a first back volume corresponding to said first MEMS transducer and a second back volume corresponding to said second MEMS transducer, and wherein said second substrate further comprises a second aperture aligned with a second transducer aperture corresponding to said second MEMS transducer.

* * * * *